US012696567B2

(12) United States Patent
Miyata et al.

(10) Patent No.: US 12,696,567 B2
(45) Date of Patent: Jul. 28, 2026

(54) OPTICAL ELEMENT, IMAGE SENSOR AND IMAGING DEVICE

(71) Applicant: NTT, Inc., Tokyo (JP)

(72) Inventors: Masashi Miyata, Musashino (JP);
Naru Nemoto, Musashino (JP);
Mitsumasa Nakajima, Musashino (JP);
Toshikazu Hashimoto, Musashino (JP)

(73) Assignee: NTT, Inc. (JP)

( * ) Notice: Subject to any disclaimer, the term of this patent is extended or adjusted under 35 U.S.C. 154(b) by 643 days.

(21) Appl. No.: 18/031,156

(22) PCT Filed: Oct. 12, 2020

(86) PCT No.: PCT/JP2020/038459
§ 371 (c)(1),
(2) Date: Apr. 11, 2023

(87) PCT Pub. No.: WO2022/079757
PCT Pub. Date: Apr. 21, 2022

(65) Prior Publication Data
US 2023/0387165 A1 Nov. 30, 2023

(51) Int. Cl.
*H10F 39/00* (2025.01)
*G02B 1/00* (2006.01)
(52) U.S. Cl.
CPC ......... *H10F 39/8063* (2025.01); *G02B 1/002* (2013.01); *H10F 39/8027* (2025.01); *H10F 39/8053* (2025.01)
(58) Field of Classification Search
CPC ............. H10F 39/8063; H10F 39/8027; H10F 39/8053; H10F 39/18; H10F 39/199;
(Continued)

(56) References Cited

U.S. PATENT DOCUMENTS 9,467,633 B2 * 10/2016 Johnson ............... H04N 25/585
2003/0156325 A1 * 8/2003 Hoshi .................. G02B 5/1809
359/489.08

(Continued)

FOREIGN PATENT DOCUMENTS

JP      2009157390      7/2009
JP      2010212625      9/2010
(Continued)

OTHER PUBLICATIONS

Fowler et al., "Automotive Image Sensors," imaging.org, Feb. 1, 2018, retrieved on Aug. 12, 2021, retrieved from URL <http://www.imaging.org/Site/PDFS/Conferences/ElectronicImaging/EI2018/Keynotes/EI2018_IMSE_Keynote_Fowler_Solhusvik.pdf>, 40 pages.

*Primary Examiner* — Seung C Sohn
(74) *Attorney, Agent, or Firm* — Fish & Richardson P.C.

(57) ABSTRACT

An optical element includes a transparent layer which covers a pixel including a first photoelectric conversion element and a second photoelectric conversion element, and a plurality of structures disposed on the transparent layer or in the transparent layer in a plane direction of the transparent layer, wherein the transparent layer includes a first region which guides incident light to the first photoelectric conversion element, and a second region which guides incident light to the second photoelectric conversion element, the plurality of structures are disposed in at least the second region among the first region and the second region, and the first region is smaller than the second region.

16 Claims, 26 Drawing Sheets

(58) Field of Classification Search
CPC ... H10F 39/8067; G02B 1/002; G02B 5/1819; G02B 2005/1804; G02B 5/1809; H04N 25/702
See application file for complete search history.

(56) References Cited

U.S. PATENT DOCUMENTS

| | | |
|---|---|---|
| 2007/0045685 A1 | 3/2007 | Yang et al. |
| 2008/0272454 A1 | 11/2008 | Toshikiyo et al. |
| 2011/0043813 A1 | 2/2011 | Yamada |
| 2015/0229833 A1 | 8/2015 | Numata et al. |
| 2017/0170222 A1 | 6/2017 | Toda |
| 2017/0315270 A1 | 11/2017 | Yasuda et al. |
| 2019/0348456 A1 | 11/2019 | Chapman et al. |
| 2020/0204786 A1 | 6/2020 | Nakata |

FOREIGN PATENT DOCUMENTS

| | | |
|---|---|---|
| JP | 2011043681 | 3/2011 |
| JP | 2016170413 | 9/2016 |
| JP | 2017046020 | 3/2017 |

* cited by examiner

OPTICAL ELEMENT, IMAGE SENSOR AND IMAGING DEVICE

CROSS-REFERENCE TO RELATED APPLICATIONS

This application is a National Stage application under 35 U.S.C. § 371 of International Application No. PCT/JP2020/038459, having an International Filing Date of Oct. 12, 2020.

The disclosure of the prior application is considered part of the disclosure of this application, and is incorporated by reference in its entirety into this application.

TECHNICAL FIELD

The present invention relates to an optical element, an imaging element and an imaging apparatus.

BACKGROUND ART

In the imaging apparatus, improvement of a dynamic range has been studied. For example, NPL 1 discloses a method for improving a dynamic range by providing a high sensitivity photodiode having a large size and a low sensitivity photodiode having a small size in one pixel.

CITATION LIST

Non Patent Literature

[NPL 1] Boyd Fowler, et al., "Automotive Image Sensors", [online], Feb. 1, 2018, Electronic Imaging 2018, [Search on Aug. 12, 2020], Internet <URL:http://www.im-aging.org/Site/PDFS/Conferences/ElectronicIm aging/EI2018/Keynotes/EI2018_IMSE_Keynote_Fowler_Solhusvik.pdf >

SUMMARY OF INVENTION

Technical Problem

When a plurality of photodiodes are provided as described above, for example, an aperture ratio of the lens pixel is lowered, and a light utilization efficiency is lowered accordingly. The light utilization efficiency is not particularly examined in the NPL 1.

An object of the present invention is to achieve both improvement in dynamic range and improvement in light utilization efficiency.

Solution to Problem

An optical element according to the present invention includes a transparent layer which covers a pixel including a first photoelectric conversion element and a second photoelectric conversion element; and a plurality of structures disposed on the transparent layer or in the transparent layer in a plane direction of the transparent layer, in which the transparent layer includes a first region which guides incident light to the first photoelectric conversion element, and a second region which guides incident light to the second photoelectric conversion element, the plurality of structures are disposed in at least the second region among the first region and the second region, and the first region is smaller than the second region.

An imaging element according to the present invention includes the optical element, and a plurality of pixels each including the first photoelectric conversion element and the second photoelectric conversion element.

An imaging apparatus according to the present invention includes the imaging element, and a signal processing control unit configured to generate an image signal based on an electric signal obtained from the imaging element.

Advantageous Effects of Invention

According to the present invention, both improvement in dynamic range and improvement in light utilization efficiency can be achieved.

DESCRIPTION OF EMBODIMENTS

Figure 1:
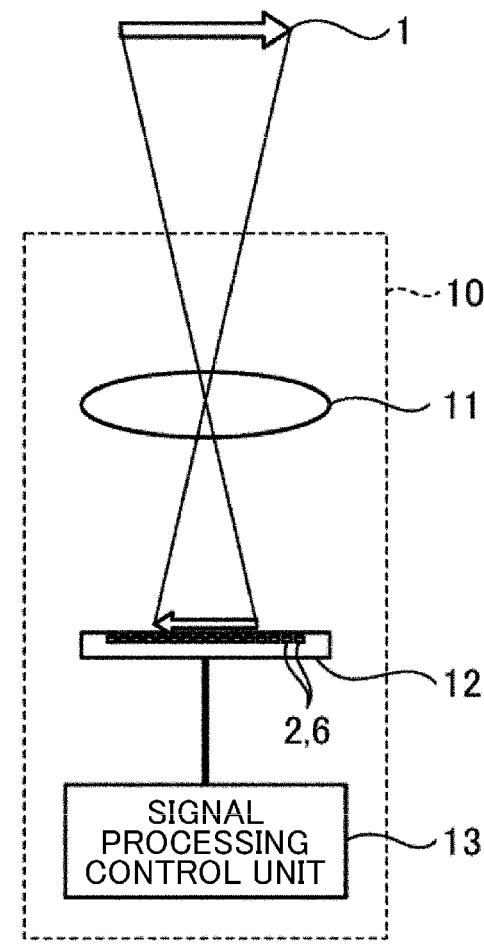
FIG. 1 is a diagram showing an example of respective schematic configurations of an optical element, an image element and an imaging apparatus according to an embodiment.

Hereinafter, embodiments of the invention will be described in conjunction with the accompanying drawings. The shape, size, positional relationship and the like shown in the drawings are merely schematic, and the present invention is not limited thereto. The same parts are denoted by the same reference numerals, and repeated explanation will not be provided.

FIG. 1 is a diagram showing an example of a schematic configuration of an optical element, an imaging element, and an imaging apparatus according to an embodiment. An imaging apparatus 10 images an object 1, using light from the object 1 (object) 7 as incident light. In this example, the object 1 is shown as a void arrow. The incident light is made incident on an imaging element 12 via a lens optical system 11. The imaging element 12 includes a plurality of pixels 2 and a plurality of optical elements 6 corresponding to the plurality of pixels 2. The pixel 2 is provided for each wavelength band (for example, for each color). The signal processing control unit 13 performs various controls related to the imaging element 12. Hereinafter, the imaging element 12 will be described in detail with reference to FIG. 2, and then a signal processing control unit 13 will be described.

Figure 2:
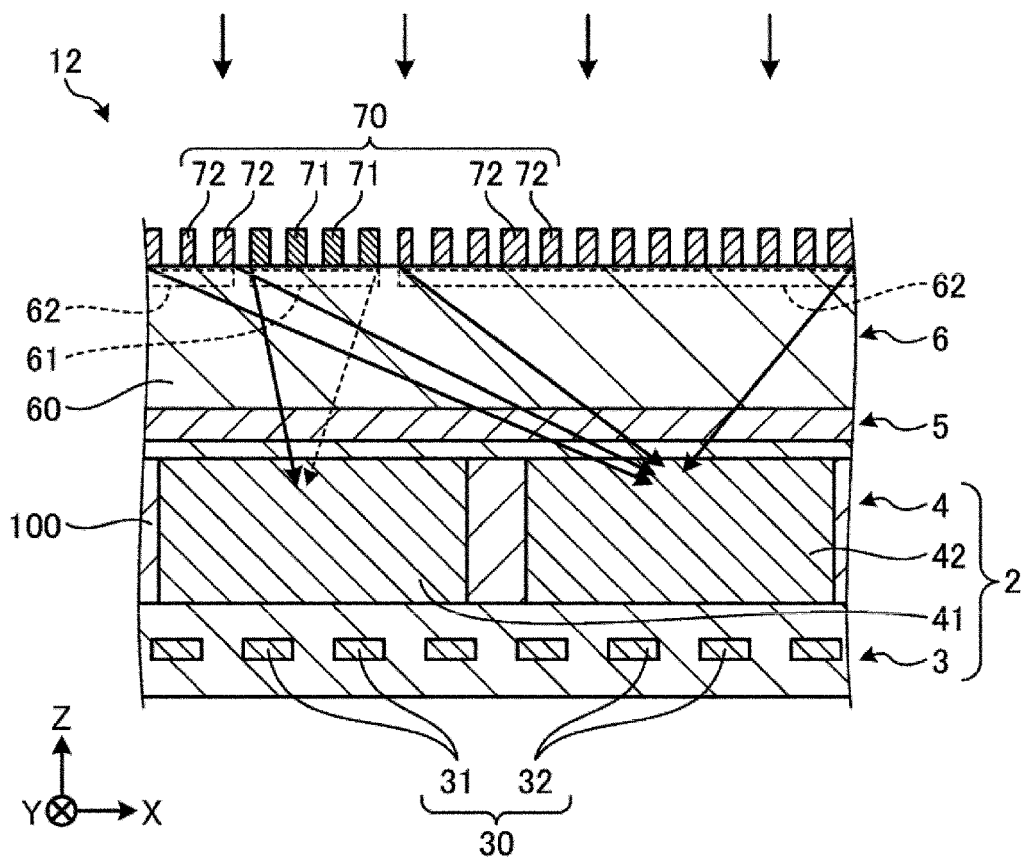
FIG. 2 is a diagram showing an example of a schematic configuration of a portion corresponding to one pixel in the imaging element.

FIG. 2 is a diagram showing an example of a schematic configuration of a portion corresponding to one pixel in the imaging element. In the drawing, an XYZ coordinate system is shown, and a traveling direction of incident light is schematically shown by an arrow. A Z-axis direction corresponds to a stacking direction of a PD layer 4, a filter layer 5 and a transparent layer 60, which will be described later. An XY plane direction corresponds to a plane direction of these layers. Hereinafter, the "plan view" indicates that the object is viewed in the Z-axis direction (for example, in a Z-axis negative direction), and "side view" indicates that the object is viewed in the X-axis direction or the Y-axis direction (for example, in a Y-axis positive direction). FIG. 2 is a cross-sectional view showing an example of a schematic configuration of a part of the imaging element 12 when viewed from the side.

The imaging element 12 includes a pixel 2, a filter layer 5, and an optical element 6. The pixel 2 includes a wiring layer 3 and a photodiode (PD) layer 4. An example of the optical element 6 is a meta-surface, and a case in which the optical element 6 is a meta-surface will be described below. The meta-surface is an element including a plurality of fine structures having a width equal to or less than the wavelength of light, and may have a two-dimensional structure or a three-dimensional structure. By using the meta-surface for the optical element, there is an effect in which the phase and the light intensity can be controlled depending on the feature of light (wavelength, polarization, and incident angle) only by changing the parameter of the microstructure, and there is an effect in which the degree of freedom in design is increased in the case of forming a three-dimensional structure.

As described from the PD layer 4 of the wiring layer 3 and the PD layer 4, the PD layer 4 includes a PD 41 (first photoelectric conversion element) and a PD 42 (second photoelectric conversion element) provided in the plane direction of the layer (XY plane direction). The PD 41 and the PD 42 are formed on the semiconductor substrate 100. The PD 41 and the PD 42 may have the same size (light-receiving area) in a plan view. The PD 41 and the PD 42 may have the same size (depth) when viewed from the side. The PD 41 and the PD 42 may have the same shape. When the PD 41 and the PD 42 have the same shape, there are merits such as improvement in manufacturing yield.

Charges generated in the PD 41 and the PD 42 are converted into an electric signal to be a base of a pixel signal by a transistor (not shown) or the like, and output to the outside of the pixel 2 through the wiring layer 3. Among the wirings included in the wiring layer 3, some wirings corresponding to the PD 41 are shown as wirings 31, and some wirings corresponding to the PD 42 are shown as wirings 32.

The filter layer 5 is a color filter through which the pixel 2 passes light of a corresponding color, and is provided on the upper surface (a surface on the Z-axis positive direction side) of the semiconductor substrate 100. In this example, the filter layer 5 is provided between the PD layer 4 and the transparent layer 60. An example of the material of the filter layer 5 is an organic material such as a resin.

The optical element 6 guides incident light to the PD 41 and the PD 42, respectively. The optical element 6 is provided face the PD layer 4, and in this example, the optical element 6 is provided on the upper surface of the filter layer 5 (Z-axis positive direction side). The optical element 6 includes a transparent layer 60 and a plurality of structures 70. In the example shown in FIG. 2, the plurality of structures 70 include a plurality of structures 71 and a plurality of structures 72 to be described later. The transparent layer 60 covers the PD 41 and the PD 42. A portion of the transparent layer 60 in which the plurality of structures 70 are not provided may have a refractive index lower than that of the structure 70. An example of a material of such a transparent layer 60 is $SiO_2$ or the like. The transparent layer 60 may be a void, and in this case, the refractive index of the transparent layer 60 is the refractive index of air. The transparent layer 60 includes a region 61 and a region 62. The region 61 is a first region that guides light incident on the region 61 to the PD 41. The region 62 is a second region that guides light incident on the region 62 to the PD 42. The "guide" of light is meant to include the transmission of light as it is, the change of the traveling direction of light (for example, the collection of light), and the like.

The region 61 and the region 62 will be further described. The region 61 is a region in which a plurality of structures 71 are provided. In the example shown in FIG. 2, the plurality of structures 71 are provided on the upper surface of the transparent layer 60 (surface of the Z-axis positive direction side), and the region 61 indicates at least a portion near the upper surface of the transparent layer 60. The region 62 is a region in which the plurality of structures 72 are provided. In the example shown in FIG. 2, the plurality of structures 72 are provided on the upper surface of the transparent layer 60, and the region 62 indicates at least a portion near the upper surface of the transparent layer 60. The region 61 and the region 62 may be located at the same height (the same position in the Z-axis direction). The plurality of structures 71 may not be present, and in that case, the region 61 may indicate a portion of the transparent layer 60 in which the plurality of structures 72 are not provided. Hereinafter, a configuration in which the plurality of structures 71 are provided in the region 61 as shown in FIG. 2 will be described, except for the case of a particular description.

The plurality of structures 70 will be described again. The plurality of structures 70 are disposed on the transparent layer 60 or in the transparent layer 60 in a plane direction (XY plane direction) of the transparent layer 60. It can be said that they are disposed in a two-dimensional direction (two-dimensional shape). As described above, in the example shown in FIG. 2, the plurality of structures 70 are provided on the upper surface of the transparent layer 60. The plurality of structures 70 may be disposed at unequal intervals, or may be disposed at equal intervals to facilitate design. Each of the plurality of structures 70 is a fine structure having a dimension that are about the same as the wavelength of incident light (nanometer order) or smaller than the wavelength of incident light. The plurality of structures 70 are designed so that the pixels 2 correspond to the corresponding colors, that is, the light of the color (pass band) of the filter layer 5. The plurality of structures 70 may be integrated into the pixels 2. When the plurality of structures 70 are provided in the transparent layer 60, the region 61 indicates at least a portion in which the plurality of structures 71 are located in the transparent layer 60. The region 62 indicates at least a portion in which the plurality of structures 72 are located in the transparent layer 60.

The plurality of structures 70 are disposed to condense incident light on the PD 41 and the PD 42. The principle of the condensing by the transparent layer 60, that is, the lens (on-chip lens) function, will be described later. In the present embodiment, the plurality of structures 70 include a plurality of structures 71 and a plurality of structures 72. The plurality of structures 71 are a plurality of first structures disposed to condense incident light on the PD 41.

The plurality of structures 72 are a plurality of second structures disposed to condense incident light on the PD 42.

Figure 3:
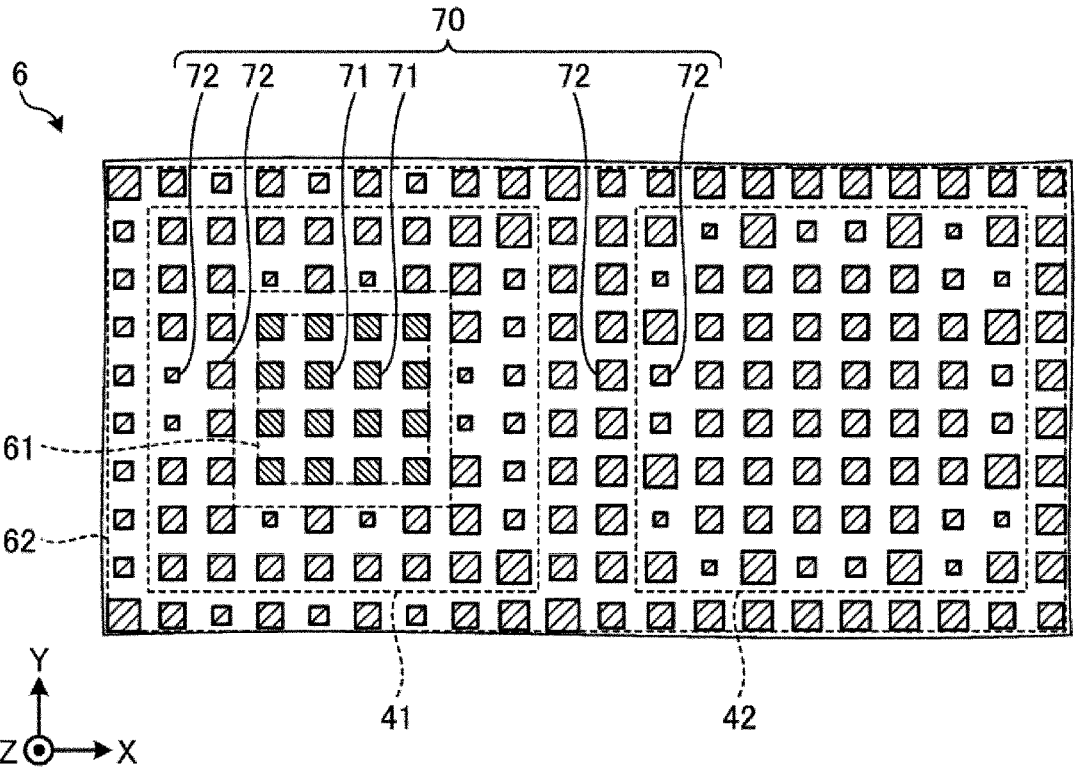
FIG. 3 is a diagram showing an example of a schematic configuration of a portion corresponding to one pixel in the imaging element.

FIG. 3 is a diagram showing an example of a schematic configuration of a portion corresponding to one pixel in the imaging element. FIG. 3 shows an example of the layout of the optical element 6, the PD 41 and the PD 42 in a plan view. The regions 61 and 62 and the PD layer 4 of the transparent layer 60 located below the plurality of structures 70 (the Z-axis negative direction side) are indicated by broken lines. In addition, hatching similar to that shown in FIG. 2 is applied to facilitate distinction between the plurality of structures 71 and the plurality of structures 72 included in the plurality of structures 70.

As shown in FIG. 3, in a plan view, the arrangement area of the plurality of structures 71 is smaller than the arrangement area of the plurality of structures 72. That is, the region 61 is smaller than the region 62. In this example, the smaller region 61 overlaps the PD 41 to be located inside the corresponding PD 41. The amount of condensed light to the PD 41 due to the plurality of structures 71 is smaller than the amount of condensed light to the PD 42 due to the plurality of structures 72 by the region 62. This will be described with reference to FIG. 4.

Figure 4:
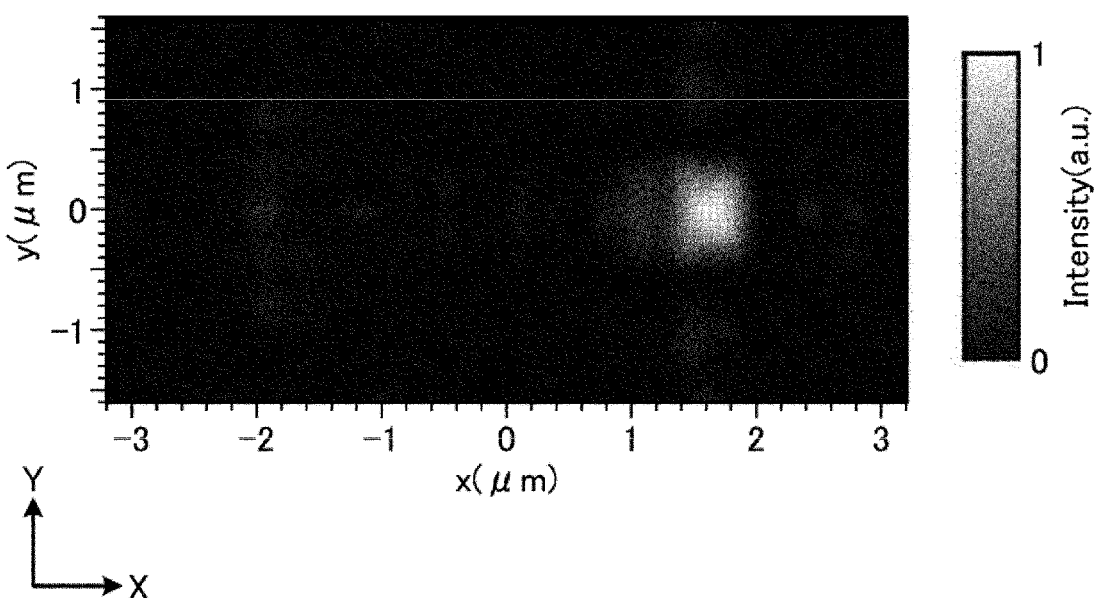
FIG. 4 is diagram showing an example of light distribution.

FIG. 4 is a diagram showing an example of the light distribution. FIG. 4 shows an example of the light condensing distribution in the PD layer 4 in a plan view. A position at which x is 0 μm corresponds to an intermediate position between the PD 41 and the PD 42 in the X-axis direction. A position at which y is 0 μm corresponds to a center position of the PD 41 and a center position of the PD 42 in the Y-axis direction. That is, a portion of about left half of FIG. 4 (portion on the X-axis negative direction side) corresponds to PD 41, and a portion of about right half (portion on the X-axis positive direction side) corresponds to PD 42. The amount of condensed light to the PD 41 is smaller than the amount of condensed light to the PD 42. Therefore, the PD 41 is more difficult to saturate than the PD 42.

An example of the configuration of the optical element 6 capable of realizing a lens function in which a plurality of lenses having different condensing positions as described above are mixed will be described with reference to FIGS. 5 and 6.

Figure 5:
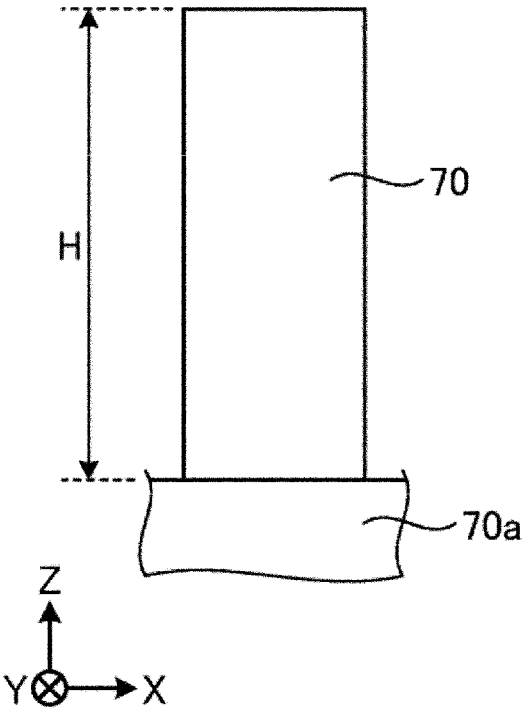
FIG. 5 is a diagram showing an example of a schematic configuration of a structure.
Figure 6:
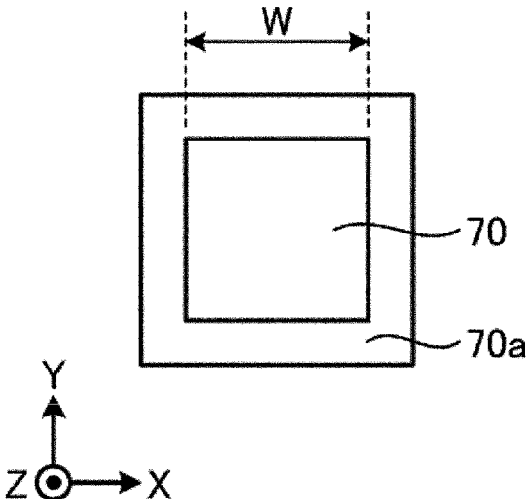
FIG. 6 is a diagram showing an example of a schematic configuration of a structure.

FIGS. 5 and 6 show an example of a schematic structure of the structure. FIG. 5 shows an example of a side view of the structure 70. FIG. 6 shows an example of a plan view (top view) of the structure 70. The structure 70 is a columnar structure having a rectangular columnar shape, and is formed on the base part 70a. The base part 70a is, for example, a quartz crystal (Quaratz) substrate.

A height of the structure 70 (length of the structure 70 in the Z-axis direction) is referred to as a height H and is shown. A width of the structure 70 (length in the X-axis direction and the length in the Y-axis direction) are referred to as the width W and are shown. In the same structure 70, the width W may be the same or different in the X-axis direction and the Y-axis direction. Hereinafter, the width W is assumed to be the same in the X-axis direction and the Y-axis direction.

The width of the base part 70a (length in the X-axis direction and the Y-axis direction) is larger than the width W of the structure 70. For example, the width of the base part 70a may be about 320 nm. In this case, the width W of the structure 70 is less than 320 nm. A difference between the width of the structure 70 and the width of the base part 70a gives a distance (interval) between the adjacent structures 70. The interval between the structures 70 may be constant (equal interval) or different for all structures 70.

The structure 70 has a refractive index different from that of other parts, more specifically, the portion between the structures 70. The structure 70 may have a refractive index higher than that of the other portions. Examples of the material of the structure 70 are SiN, TiO$_2$ or the like.

Features of the structure 70 can be changed by changing at least one of the width W and the refractive index. An example in which the features are changed according to the width W among the width W and the refractive index will be described below. An example of the features of the structure 70 is transmittance of light passing through the structure 70 and phase (light phase delay amount). This will be described with reference to FIGS. 7 and 8. As can be understood from FIG. 2 and the like described above, since the incident light passes through the structure 70 in the Z-axis direction, the case in which the light passes through the structure 70 in this direction will be described below.

Figure 7:
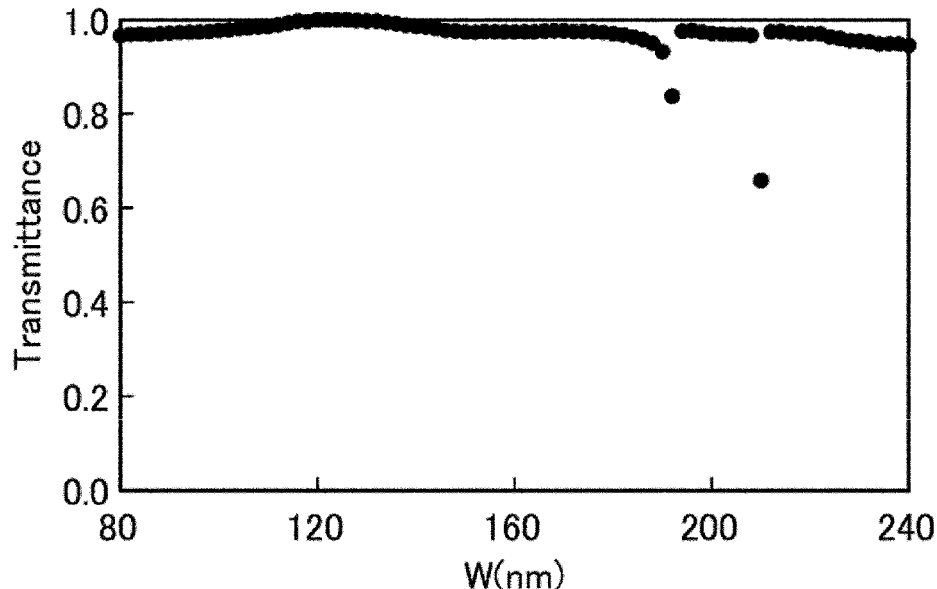
FIG. 7 is a diagram showing an example of the feature of the structure.
Figure 8:
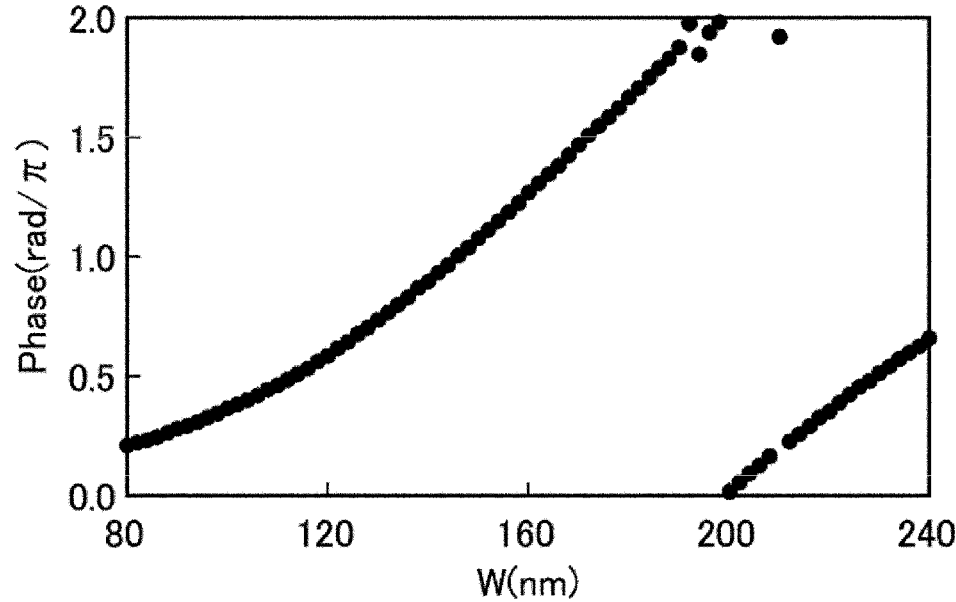
FIG. 8 is a diagram showing an example of the feature of the structure.

FIGS. 7 and 8 are diagrams showing examples of the features of the structure. FIG. 7 shows a relationship between the width W of the structure 70 and the transmittance of light passing through the structure 70. The wavelength of light is 520 nm As shown in FIG. 7, a high transmittance of approximately 1.0 can be obtained over a width W of 80 nm to 240 nm. In the drawing, although there is a wavelength whose transmittance is greatly reduced than other wavelengths, this may occur due to the relationship with the period, structure width, etc. of the structure 70. The period, the width of the structure, and the like, of the structure 70 may be designed to prevent such a decrease in the transmittance.

FIG. 8 shows a relationship between the width W of the structure 70 and the phase of the light passing through the structure 70. The structure 70 gives an optical phase delay amount corresponding to the size of the width W to the incident light. By changing the width W in the range of 80 nm to 240 nm in which the above-mentioned high transmittance can be obtained, the phase can be changed by $2\pi$ or more.

By using the structure 70 having the above features, a phase control over a wide range of $2\pi$ or more can be performed, while maintaining high light transmittance. A lens function is obtained, by disposing the plurality of structures 70 in the plane direction of the transparent layer 60 to obtain desired phase features at each position of the optical element 6. This will be described with reference to FIGS. 9 to 11.

Figure 9:
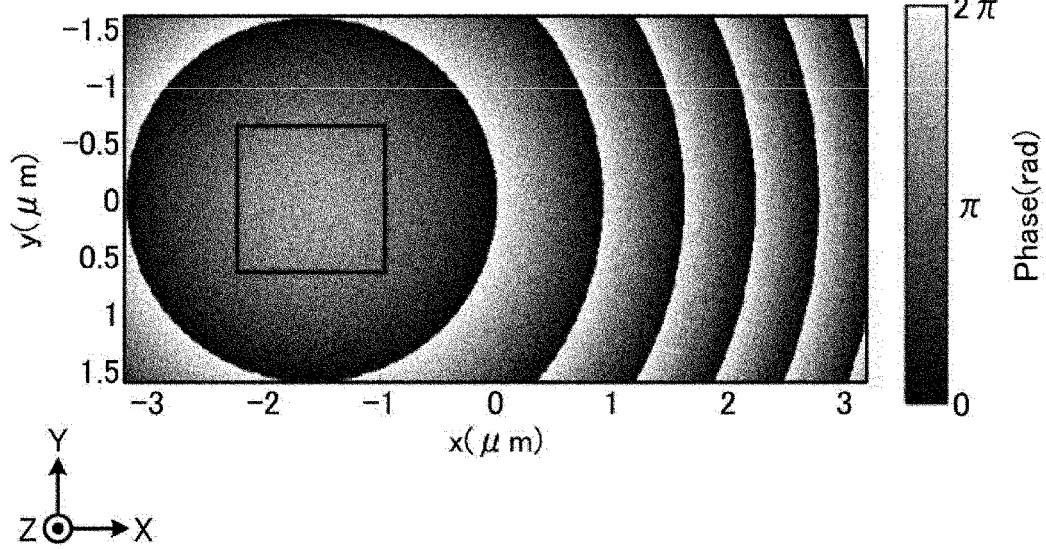
FIG. 9 is a diagram which shows an example of a lens design of the optical element.
Figure 10:
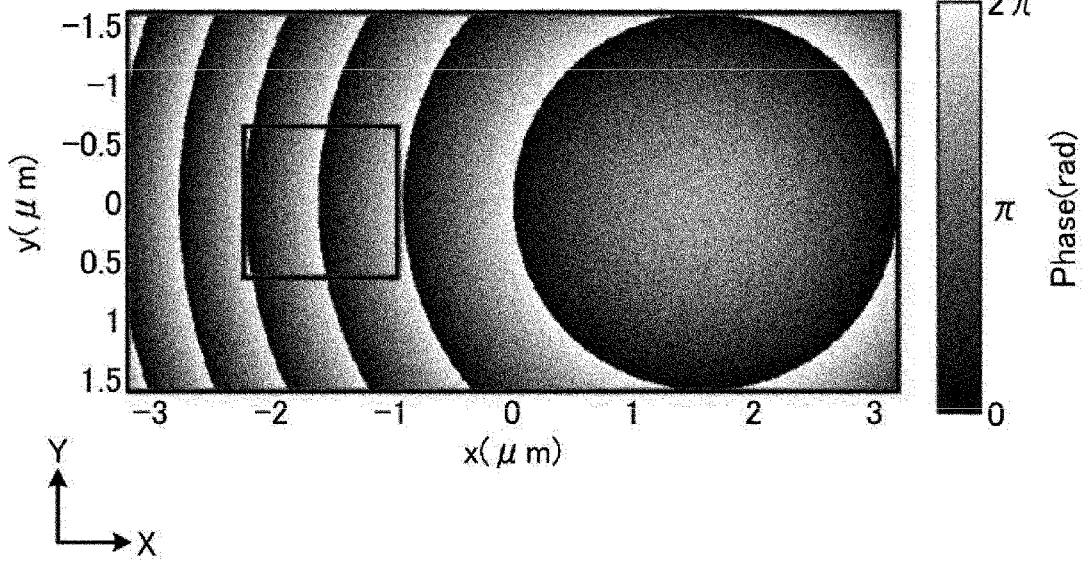
FIG. 10 is a diagram which shows an example of a lens design of the optical element.
Figure 11:
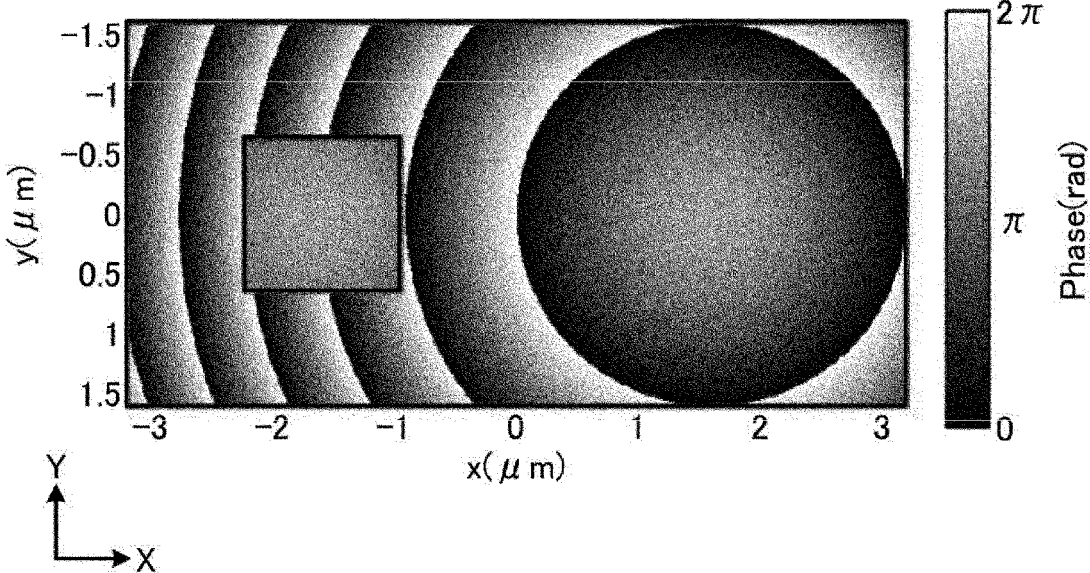
FIG. 11 is a diagram which shows an example of a lens design of the optical element.

FIGS. 9 to 11 are diagrams showing an example of a lens design of an optical element. The design conditions are as follows:

The size of the PD 41 and the PD 42 in a plan view: 3.2 µm×3.2 µm

Focus distance: 4.8 µm.

Designed wavelength: 520 nm

Area ratio of lens pattern: 0.08 (8%)

The area ratio of the lens pattern is a ratio of the pattern area used for condensing light to the PD 41 to the pattern area used for condensing light to the PD 41 and the PD 42.

The phase distribution (optical phase delay amount distribution) of the lens having a desired condensing position is represented, for example, by the following Formula.

[Math. 1]

$$\text{Phase distribution } \varphi(x, y) = \tag{1}$$
$$-\frac{2\pi}{\lambda_d}n_{sub}\left(\sqrt{(x-x_f)^2 + (y-y_f)^2 + z_f^2} - \sqrt{x_f^2 + y_f^2 + z_f^2}\right) + C$$

In the above Formula (1), $\lambda_d$ represents a designed wavelength. ($x_f$, $y_f$, $z_f$) represent condensing positions. nsub represents the refractive index of the transparent substrate 7 (the base part 70a of FIG. 5). C represents an arbitrary constant. In the example shown in FIGS. 9 to 11, which will be described below, $x_f=\pm16$ µm, $y_f=0$ µm, and $z_f=4.8$ µm (focal distance). The value of the phase distribution is converted to fall within the range of 0 to $2\pi$. For example, $-0.5\pi$ is converted into $1.5\pi$, and $2.5\pi$ is converted into $0.5\pi$, respectively.

FIG. 9 shows an example of the phase distribution of the optical element 6 for condensing incident light on the PD 41. The center position of the circular distribution (the center position of the lens) corresponds to the center position of the PD 41. In particular, the phase change is repeated as it progresses from the circular portion to the right side (X-axis positive direction side). Among them, the phase distribution shown on the inside of the square is used for the arrangement of the plurality of structures 71. The area of the square corresponds to the arrangement area (size of the region 61) of the plurality of structures 71. In this example, the center of the square corresponds to the center of the PD 41. However, the position of the square may be arbitrarily determined. The shape is not limited to a square, and this will be described later with reference to FIGS. 22 to 26.

FIG. 10 shows an example of the phase distribution of the optical element 6 for condensing the incident light on the PD 42. The center position of the circular distribution (lens center position) corresponds to the center position of the PD42. In particular, the phase change is repeated as it progresses from the circular portion to the left side (X-axis negative direction side). Among them, the phase distribution shown on the outside of the square is used for the arrangement of the plurality of structures 72. The area outside the square corresponds to the placement area of the structure 72 (the size of the region 62).

FIG. 11 shows an example of the phase distribution of the optical element 6 for condensing incident light on the PD 41 and the PD 42. This phase distribution is a phase distribution obtained by combining the phase distribution on the inside of the square in FIG. 9 and the phase distribution on the outside of the square in FIG. 10.

In order to provide the phase distribution shown in FIG. 11, a plurality of structures 70, that is, a plurality of structures 71 and a plurality of structures 72 are disposed in the transparent layer 60 of the optical element 6. Each of the structures 70 has a width W that provides the phase distribution (optical phase delay amount distribution) shown in FIG. 11. Therefore, in a plan view, at least some of the structures 70 of the plurality of structures 70 have widths W different from each other. The heights H of the plurality of structures 70 may be the same. That is, when viewed from the side, the plurality of structures 70 may have the same height H.

The condensing of the PD 41 and PD 42 due to the optical element 6 designed as described above will be described with reference to FIGS. 12 to 14.

Figure 12:
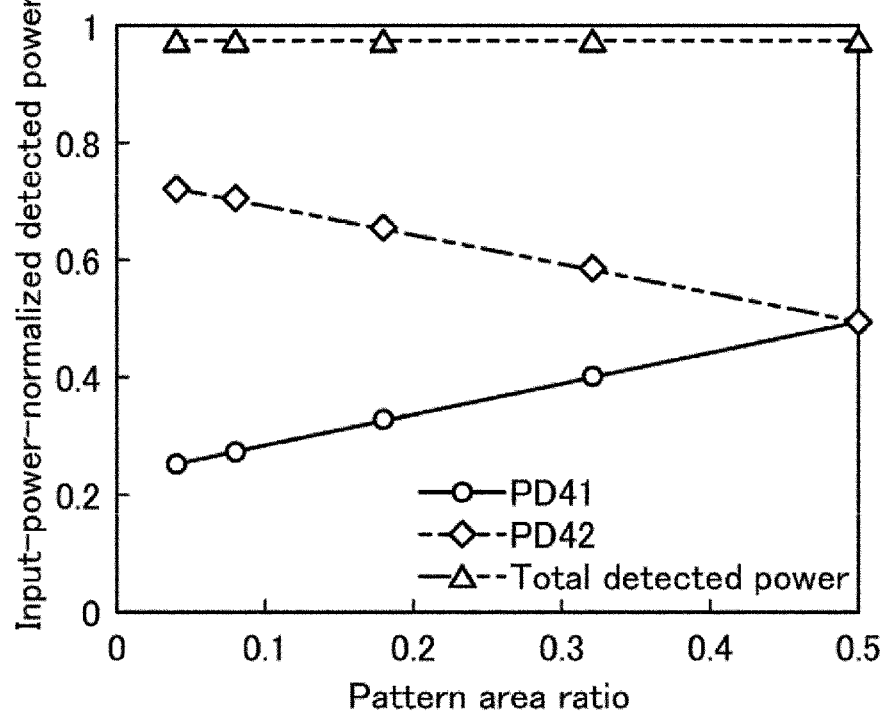
FIG. 12 is a diagram showing an example of an amount of light (detected light amount) guided to PD.
Figure 13:
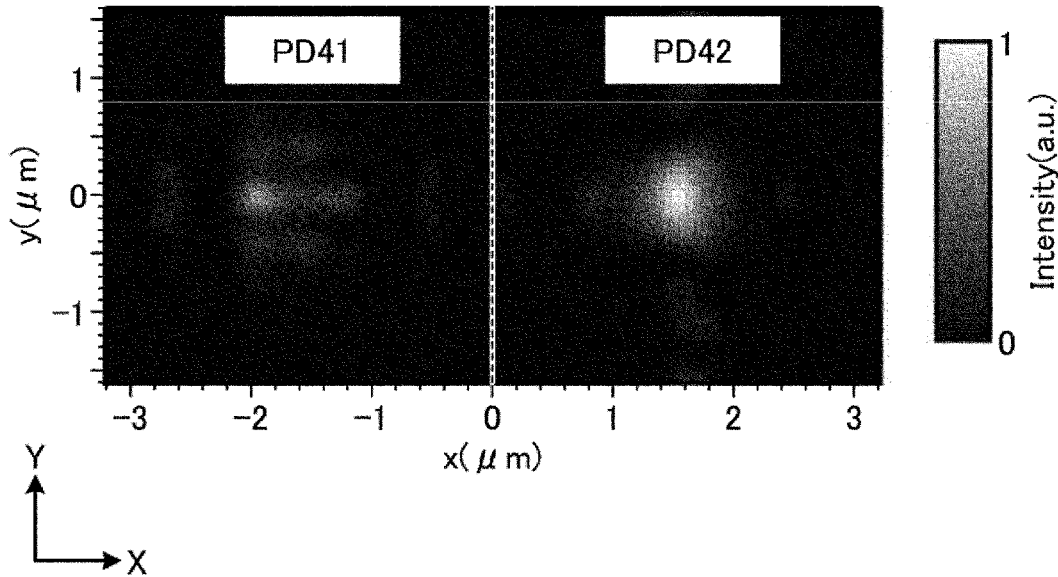
FIG. 13 is a diagram showing an example of an amount of light (detected light amount) guided to PD.
Figure 14:
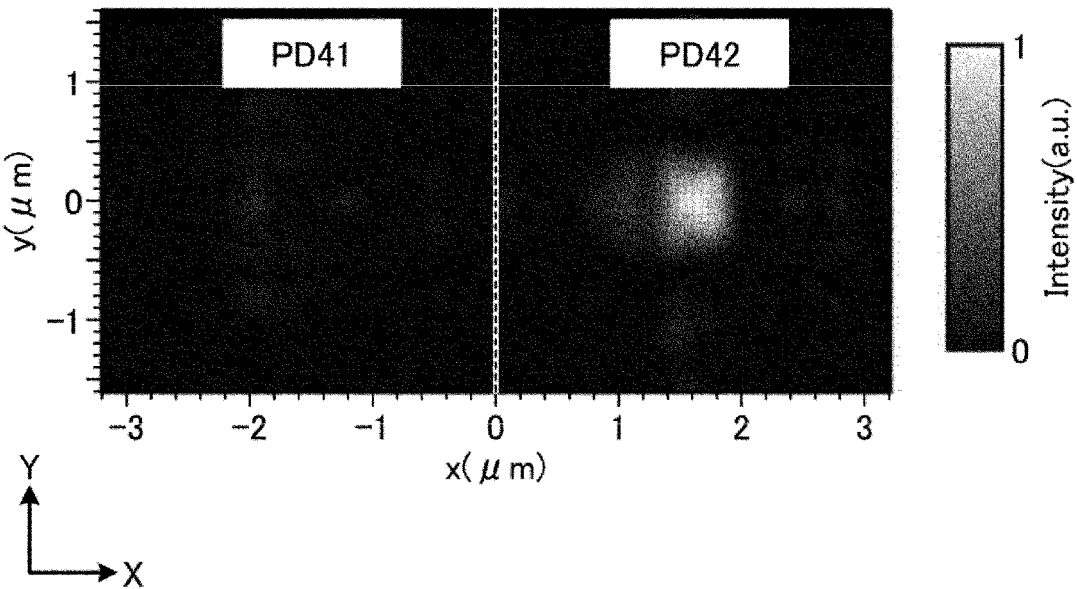
FIG. 14 is a diagram showing an example of an amount of light (detected light amount) guided to PD.

FIGS. 12 to 14 are diagrams showing an example of the amount of light guided to the PD (detected light amount). Here, it will be described as the amount of condensed light. The wavelength of light is 520 nm. The amount of light is an average amount of light of both polarizations (for example, polarization in the X-axis direction and polarization in the Y-axis direction). This point is the same in FIGS. 15 to 17, which will be described later. A horizontal axis of a graph of FIG. 12 is a ratio of the arranged area of the structure 71 (the size of the region 61) to the arranged area of the plurality of structures 71 and the plurality of structures 72 (the size of the region 61 and the region 62). A vertical axis of the graph indicates the amount of light normalized by the amount of incident light. A graph line passing through the round plot indicates the amount of condensed light to the PD 41. A graph line passing through the rhombus plot indicates the amount of light focused on the PD 42. A graph line passing through the triangular plot indicates the total light amount of the light amount condensed to the PD 41 and the light amount condensed to the PD 42.

As can be seen from FIG. 12, as the arrangement area (size of the region 61) of the plurality of structures 71 increases, the amount of condensed light (round plot) on the PD 41 increases, and the amount of condensed light to the PD 42 (rhombus plot) decreases. From this, it can be seen that the transparent layer 60 has a lens function capable of controlling light condensing on the PD 41 and light condensing on the PD 42. In addition, the amount of condensed light (triangular plot) on the entire PD exceeds 0.97 (97%), and high light utilization efficiency is obtained.

FIG. 13 shows an example of the light condensing distribution when the ratio of the arrangement areas of the plurality of structures 71 is 0.32. The amount of condensed light to the PD 41 is smaller than the amount of condensed light to the PD 42. FIG. 14 shows an example of the light condensing distribution when the ratio of the arrangement areas of the plurality of structures 71 is 0.08. The amount of condensed light to the PD 41 is smaller than the amount of condensed light to the PD 42. From these, it is also understood that the light condensation on the PD 41 and the PD 42 can be controlled by the arrangement region of the plurality of structures 71.

The lens function by the optical element 6 may be designed for each corresponding color of the PD 41 and the PD 42. By designing the optical element 6 for each color, as will be described with reference to FIGS. 15 to 17, it is possible to realize a lens function with low wavelength dependence in the wavelength range used for each pixel (the wavelength band surrounded by the broken line marked B in FIG. 15 as an example).

Figure 15:
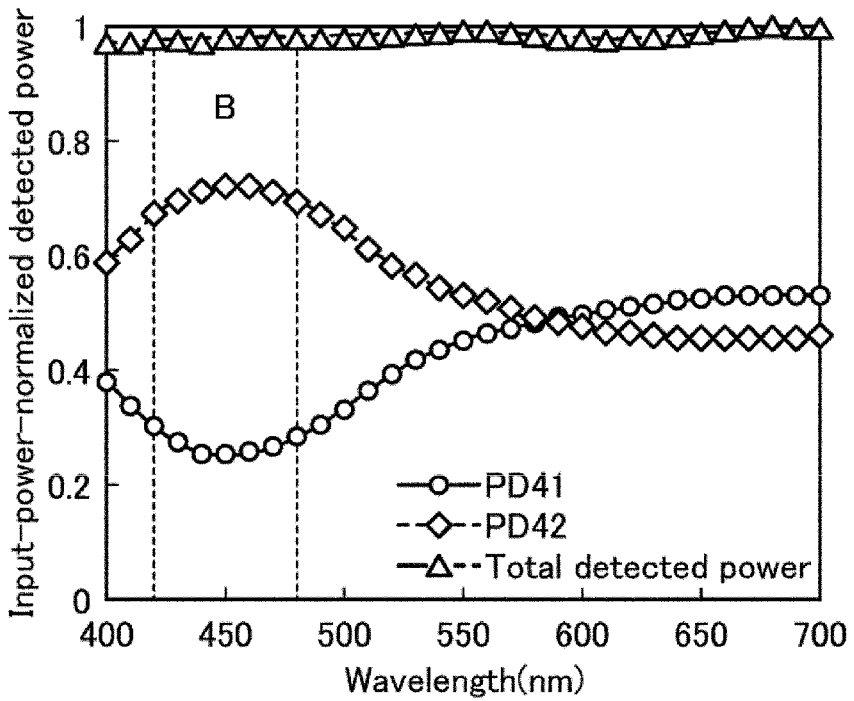
FIG. 15 is a diagram showing a wavelength dependence of a light amount ratio of the light guided to each PD.
Figure 16:
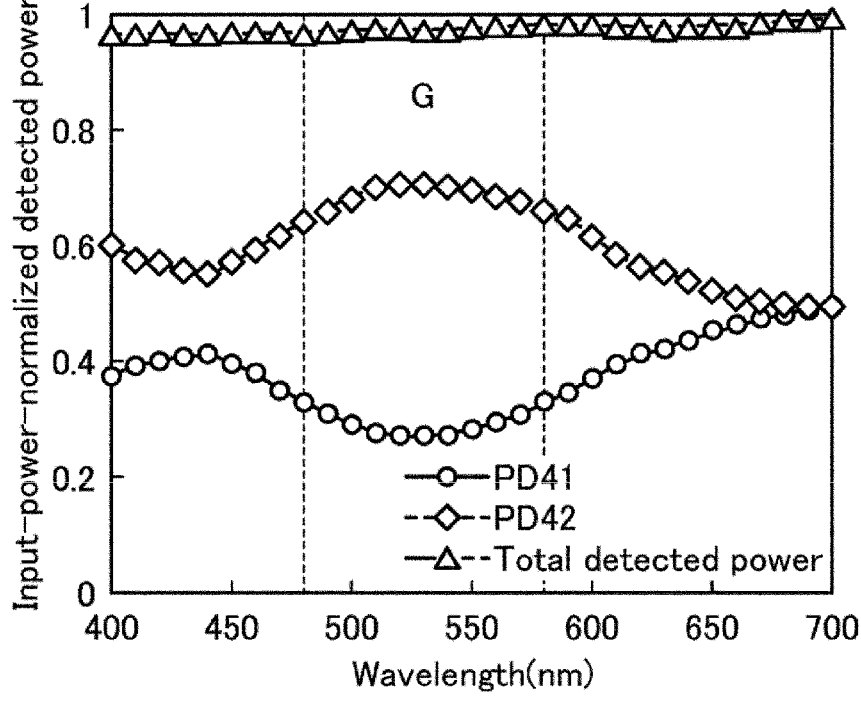
FIG. 16 is a diagram showing a wavelength dependence of a light amount ratio of the light guided to each PD.
Figure 17:
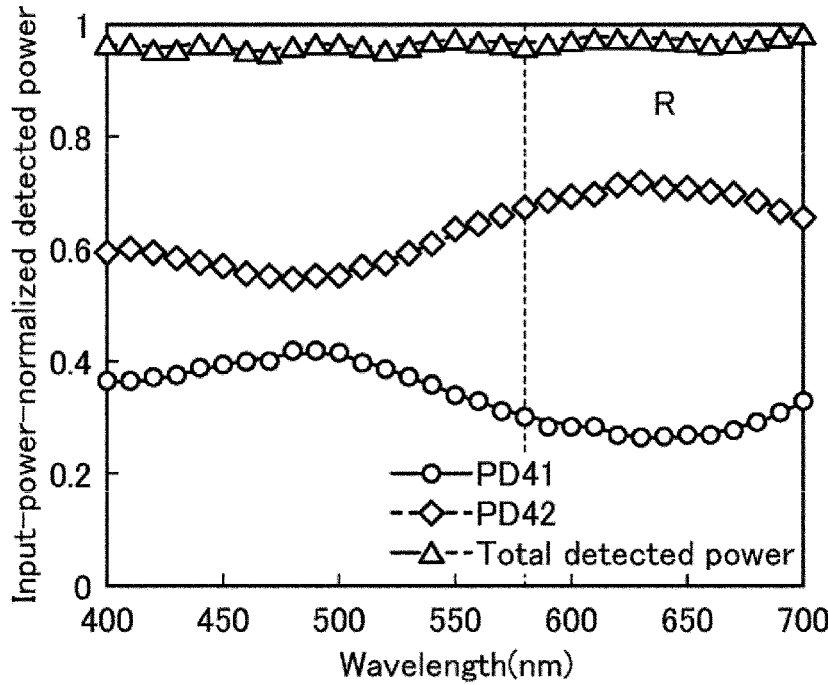
FIG. 17 is a diagram showing a wavelength dependence of a light amount ratio of the light guided to each PD.

FIGS. 15 to 17 are diagrams showing the wavelength dependency of the ratio of the amount of light guided to each PD (the ratio of the amount of condensed light in this example). FIG. 15 shows an example of the amount of light condensed on the PD 41 and the PD 42 by the transparent layer 60 designed to be adapted to blue (B). A design range including the center wavelength 450 nm is shown by a broken line. It is understood that a large wavelength dependency is not observed around the designed wavelength, and a pixel corresponding to blue can be easily designed.

FIG. 16 shows an example of the amount of light condensed on the PD 41 and the PD 42 by the transparent layer 60 designed to be adapted to green (G). A design range including the center wavelength 520 nm is indicated by a broken line. It can be seen that a large wavelength dependency is not observed around the designed wavelength, and a pixel corresponding to green can be easily designed.

FIG. 17 shows an example of the amount of light condensed on the PD 41 and the PD 42 by the transparent layer 60 designed to be adapted to red (R). A design range including the center wavelength 635 nm is shown by a broken line. It can be seen that a large wavelength dependency is not observed around the designed wavelength, and pixels corresponding to red can be easily designed.

When these design wavelengths are determined in accordance with the wavelength features of the color filters of the respective colors, a structure having an optimum intensity ratio can be designed.

As described above, in the imaging element 12 according to the embodiment, the optical element 6 functions as a lens for condensing incident light on the PD 41 and the PD 42 in each pixel 2. Referring again to FIGS. 2 and 3, since the region 61 for condensing the incident light on the PD 41 is smaller than the region 62 for condensing the incident light on the PD 42, the amount of condensed light to the PD 41 is smaller than the amount of condensed light to the PD 42. Therefore, the PD 41 is more difficult to saturate than the PD 42. In such a pixel 2, for example, the dynamic range can be improved, using the PD 41 as a low sensitivity photodiode and, using the PD 42 as a high sensitivity photodiode. Since the ratio of the amount of condensed light to the entire PD to the incident light is close to 100%, high light utilization efficiency can be realized.

Referring again to FIG. 1, some examples of the control by the signal processing control unit 13 of the imaging apparatus 10 will be described. The signal processing control unit 13 generates an image signal on the basis of an electric signal output from the imaging element 12. In order to obtain an electric signal, the signal processing control unit 13 also controls the imaging element 12. The control of the imaging element 12 includes exposure of the pixel 2 of the imaging element 12, conversion of the electric charge accumulated in the PD layer 4 into an electric signal, reading of the electric signal, and the like. The exposure of the pixel 2 includes the exposure of the PD 41 and the PD 42, and the exposure of each of the PD 41 and the PD 42 may be individually controlled. Since a high dynamic range is realized by the imaging element 12 as described above, some examples of control by the signal processing control unit 13 using the high dynamic range will be described.

The signal processing control unit 13 may generate a pixel signal, using an electric signal (first electric signal) corresponding to the charge (detected light) generated by the photoelectric conversion in the PD 41, and an electric signal (second electric signal) corresponding to the electric charge generated by the photoelectric conversion in the PD 42, and may further generate an image signal. For example, a pixel signal may be generated on the basis of a composite signal of the first electric signal and the second electric signal. By using the first electric signal, it is possible to cope with the imaging of a bright place (a high light illuminance place). By using the second electric signal, it is possible to cope with the imaging of a dark place (a low light illuminance place). Since both the bright place and the dark place can be imaged by one imaging, a scene in which low light illuminance and high light illuminance are mixed can be imaged. For example, the present invention is useful when the imaging apparatus 10 is mounted on a vehicle or the like passing through tunnels having different brightness inside and outside.

The signal processing control unit 13 may control exposure of the PD 41 and the PD 42 so that exposure periods of the PD 41 and the PD 42 are different. For example, a transistor or the like for controlling the photoelectric conversion operation (the reset, accumulation, and the like of the charge) of the PD 41 and the PD 42 may be provided to be individually controllable for each of the PD 41 and the PD 42. The signal processing control unit 13 exposes the PD 41 and the PD 42 in mutually different exposure periods by driving the transistors or the like at different timings.

The signal processing control unit 13 may control exposure of the PD 41 and the PD 42 so that an exposure period of at least one of the PD 41 and the PD 42 is longer than a predetermined period. An example of the predetermined period is a period longer than a blinking period (e.g., 20 ms=1/50 Hz) of lighting, traffic lights, and the like. As a result, the flicker can be suppressed.

The signal processing control unit 13 may control exposure of the PD 41 and the PD 42 so that an exposure period of the PD 41 is longer than an exposure period of the PD 42. By suppressing the exposure period of the PD 42 to avoid saturation, for example, occurrence of halation or the like can be suppressed.

Although the embodiment of the present disclosure has been described above, the imaging element and the imaging apparatus according to the embodiment can be variously modified within the scope not departing from the spirit of the embodiment. Some modified examples will be described.

In the above embodiment, an example of designing the lens of the optical element on the basis of an asymmetric phase distribution in which phase changes are repeated only from the lens center position toward one side has been described (FIGS. 3 and 9 to 11, and the like). However, the lens design of the optical element may be performed on the basis of a phase distribution symmetrical from the lens center position. This will be described with reference to FIGS. 18 to 21.

Figure 18:
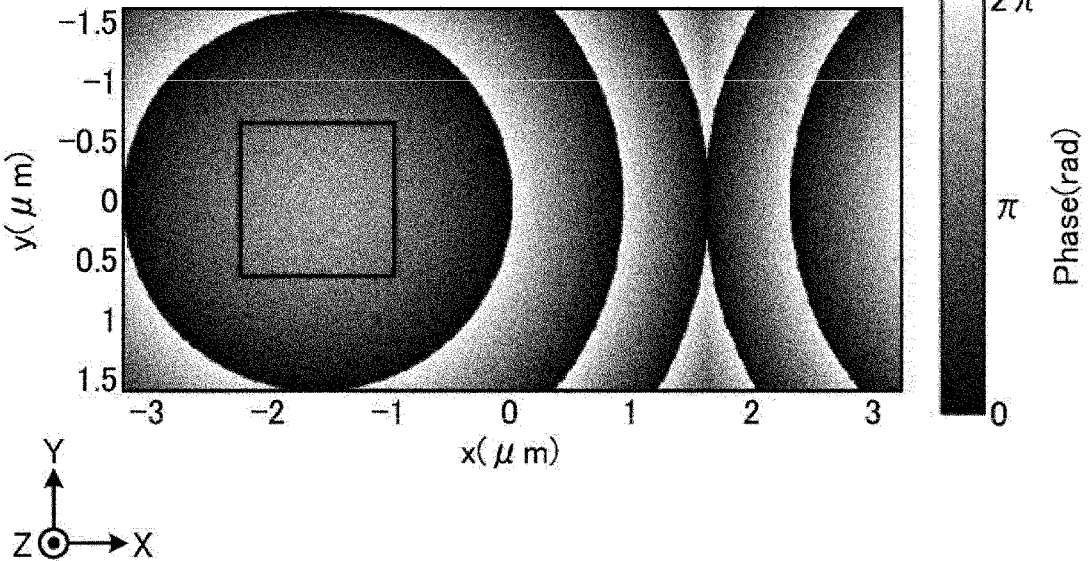
FIG. 18 is a diagram showing an example of lens design of the optical element.
Figure 19:
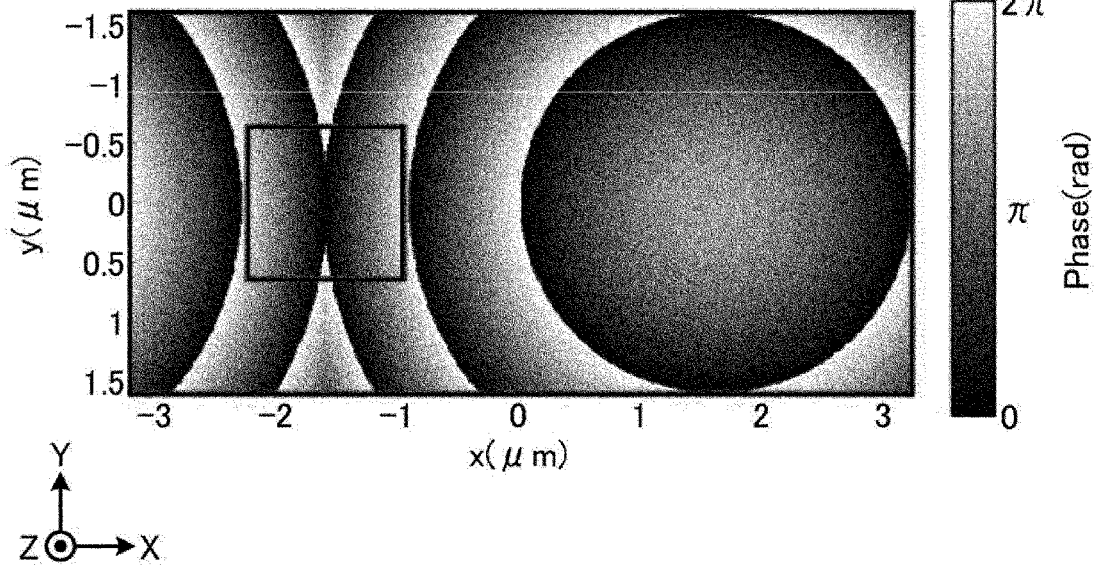
FIG. 19 is a diagram showing an example of lens design of the optical element.
Figure 20:
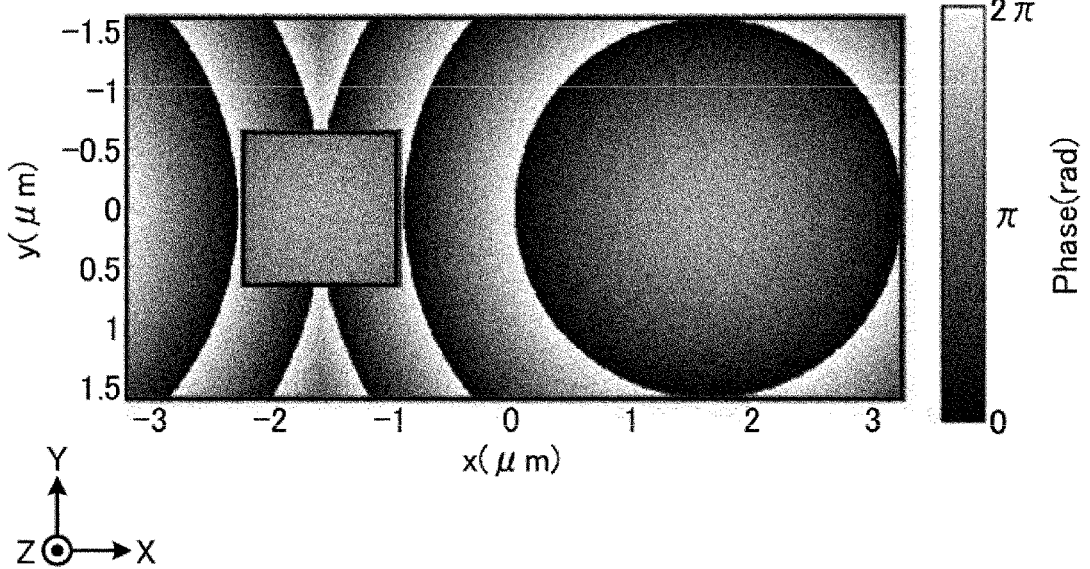
FIG. 20 is a diagram showing an example of lens design of the optical element.
Figure 21:
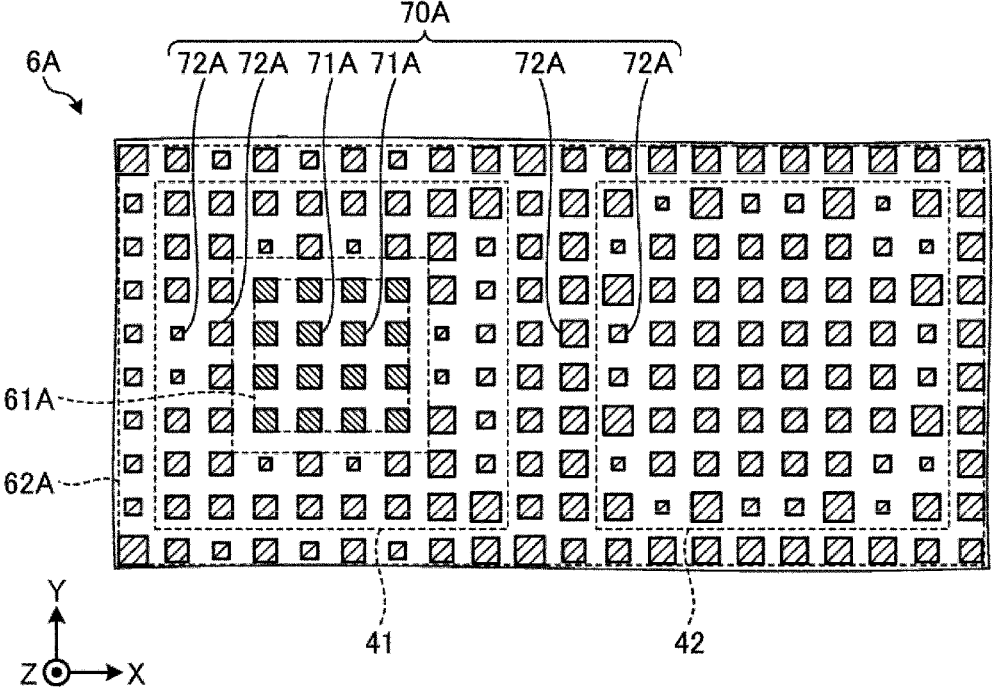
FIG. 21 is a diagram showing an example of lens design of the optical element.

FIGS. 18 to 20 are diagrams showing an example of a lens design of an optical element. FIG. 21 is a conceptual diagram showing an example of a schematic structure of the imaging element. FIG. 18 shows an example of the phase distribution of the optical element for condensing incident light on the PD 41.

The phase distribution shown in FIG. 18 is the phase distribution of an optical element for condensing incident light on the PD 41. This phase distribution is a symmetrical phase distribution in which phase changes are repeated from the center position of the distribution spreading in a circular shape toward both sides. The phase change repeated toward the right side (X-axis positive direction side) ends in the middle, and after that, the phase distribution for condensing the incident light appears on the PD of the adjacent pixel.

The phase distribution shown in FIG. 19 is a phase distribution of an optical element for condensing incident light on the PD 42. This phase distribution is a symmetrical phase distribution in which phase changes are repeated from the center position of the distribution spreading in a circular shape toward both sides. The phase change repeated toward the left side (X-axis negative direction side) ends in the middle, and after that, a phase distribution for condensing the incident light appears on the PD of the adjacent pixel.

FIG. 20 shows a phase distribution obtained by combining FIGS. 18 and 19. FIG. 21 shows an example of a planar layout of an optical element 6A for realizing the phase distribution shown in FIG. 20. In the optical element 6A, among a plurality of structures 70A, a plurality of structures 71A are provided in a region 61A, and a plurality of structures 72A are provided in a region 62A. When the phase distribution in the region 61A is not considered, that is, the phase distribution in the region of the region 62A has symmetry except the phase distribution in the region 61A and the position symmetric therewith. When the phase distribution in the region 62A is not considered, that is, except the region 62A and the phase distribution at the position symmetrical therewith, the phase distribution in the region 61A has symmetry. Since the design method of the transparent layer according to the phase distribution is as described above, the description will not be repeated here.

According to the optical element 6A, the possibility that a preferable lens pattern can be obtained increases because the phase distribution has symmetry. For example, an angle range of light incident on the right side (X-axis positive direction side) of the center of the lens, and an angle range of light incident on the left side (X-axis negative direction side) of the lens center are easily aligned.

In the above embodiment, an example will be described in which the region 61 (plurality of structures 71) is defined as a rectangular shape portion (inside the rectangle) and the region 62 (plurality of structures 72) is defined as another portion in the transparent layer 60. However, the regions 61 and 62 may be defined in various other shapes. A specific example of this case will be described with reference to FIGS. 22 to 26.

FIGS. 22 to 26 are diagrams which show an example of the arrangement region of the structure. In the drawing, the shape of each structure is not shown, and only the arrangement region of the structure is schematically shown.

Figure 22:
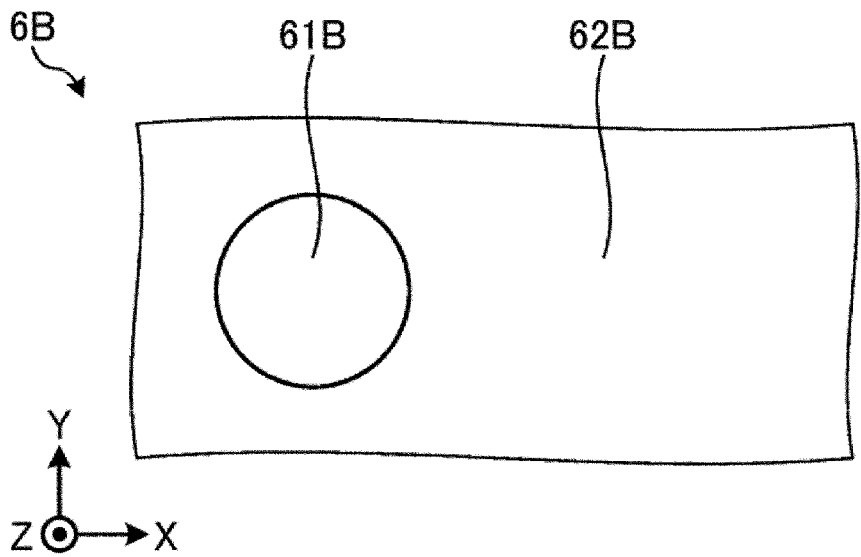
FIG. 22 is a diagram showing an example of an arrangement region of the structure.

In the optical element 6B shown in FIG. 22, the region 61B is defined as a circular shape part, and the region 62B is defined as a remaining part. The region 61B corresponds to the region 61 or the region 61A described so far. The region 62B corresponds to the region 62 or 62A described so far.

Figure 23:
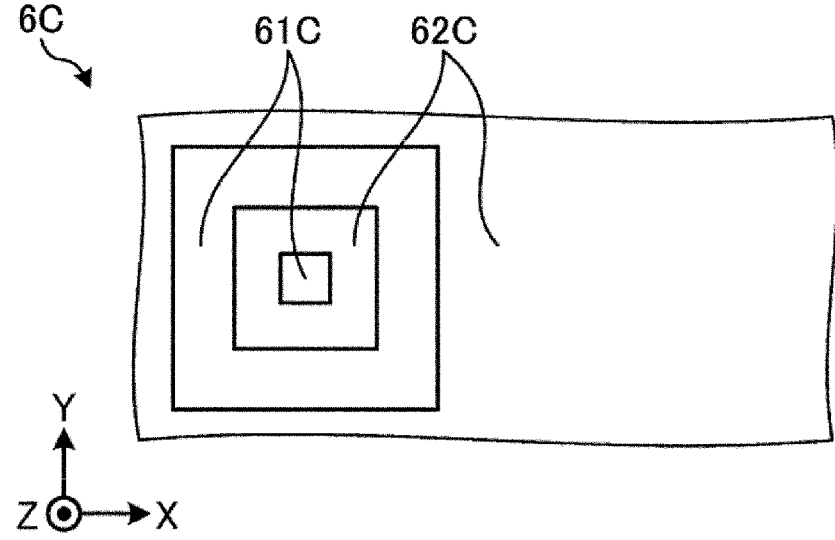
FIG. 23 is a diagram showing an example of an arrangement region of the structure.

In an optical element 6C shown in FIG. 23, a region 61C is defined as a central rectangular part and a rectangular ring-shaped part separated from it and including it inside, and the region 62 is defined as the remaining part. The region 61C corresponds to the region 61 or 61A described so far. The region 62C corresponds to the region 62 or region 62A described so far.

Figure 24:
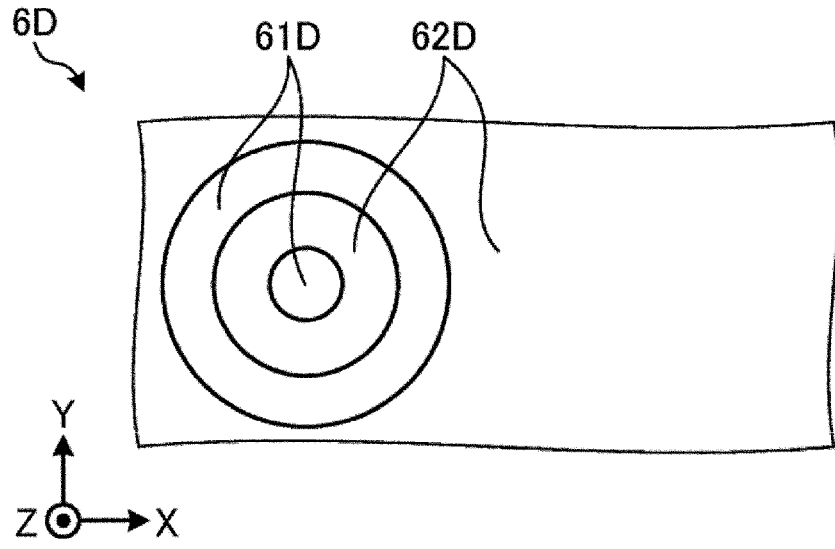
FIG. 24 is a diagram showing an example of an arrangement region of the structure.

In an optical element 6D shown in FIG. 24, a region 61D is defined as a central circular-shaped part, and a circular ring-shaped part is separated from it and including it inside, and a region 62D is defined as the remaining part The region 61D corresponds to the region 61 or the region 61A described so far. The region 62D corresponds to the region 62 or the region 62A described so far.

Figure 25:
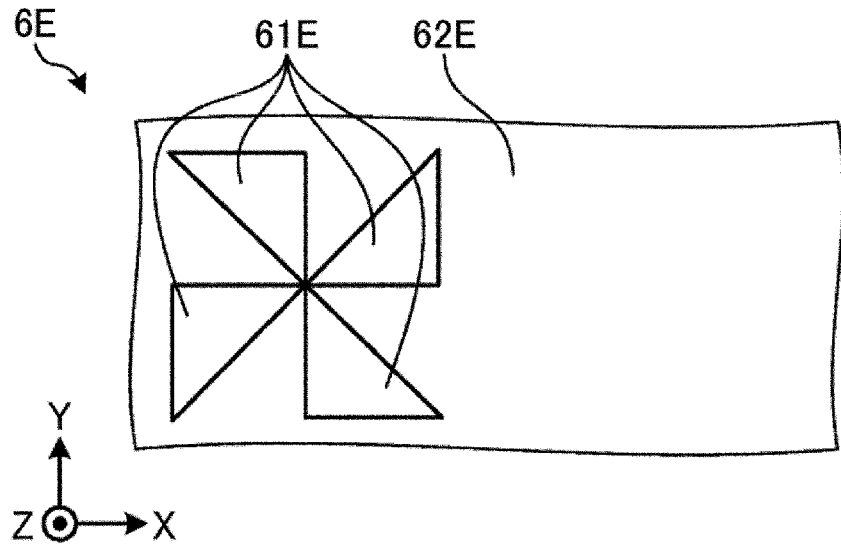
FIG. 25 is a diagram showing an example of an arrangement region of the structure.

In an optical element 6E shown in FIG. 25, a region 61E is defined as four triangular portions spaced apart in a direction of rotation (interval of 90° in this example), and region 62E is defined as a remaining part. The region 61E corresponds to the region 61 or the region 61A described so far. The region 62E corresponds to the region 62 or the region 62A described so far.

Figure 26:
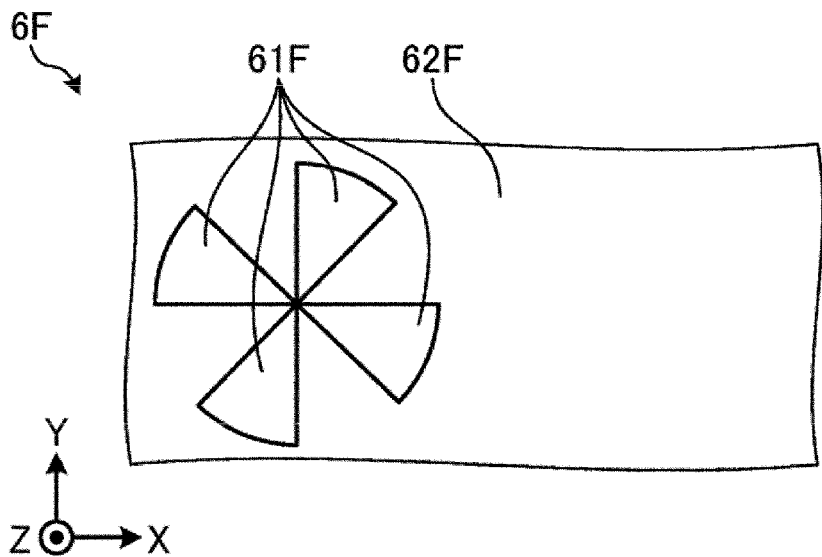
FIG. 26 is a diagram showing an example of an arrangement region of the structure.

In an optical element 6F shown in FIG. 26, a region 61F is defined as four fan-shaped parts spaced apart in the direction of rotation (an interval of 90° in this example), and a region 62F is defined as a remaining part. The region 61F corresponds to the region 61 or the region 61A described so far. The region 62F corresponds to the region 62 or the region 62A described so far.

In addition, two kinds of regions may be disposed in various shapes (not shown). From the viewpoint of continuity of phase distribution, a shape having a small boundary between two kinds of regions may be adopted.

In the above embodiment, an example in which each pixel 2 includes two PDs 41 and 42 having different amounts of condensed light has been described. However, each pixel may have three, four or more PDs having different amounts of condensed light. In this case, the optical element includes a plurality of structures disposed in different arrangement regions depending on the amount of condensed light to each PD. For example, when four PDs are used, a plurality of first and fourth structures are disposed in four divided regions of the transparent layer 60 to have different areas. The PDs may be disposed one-dimensionally or two-dimensionally.

In the above embodiment, an example in which a plurality of structures 70 are provided on the transparent layer 60 has been described. However, the plurality of structures 70 may be provided in the transparent layer 60. The plurality of structures 70 may be provided on a lower surface of the transparent substrate. In this case, the transparent layer 60 is an air layer. The configuration in which the plurality of structures 70 are provided on the transparent layer 60, similar to the above-described embodiment, can also be realized by forming a plurality of recesses in portions corresponding to the plurality of structures 70 and by forming voids of the plurality of recesses to have a higher refractive index than the material constituting the plurality of recesses. The configuration in which the portions corresponding to the plurality of structures 70 become the plurality of recesses can be realized, by filling the voids of the plurality of recesses with a fluid having a refractive index higher than that of the material constituting the plurality of recesses, and by making the material constituting the plurality of recesses a meta-material having a refractive index lower than 1.

In the above embodiment, an example in which a plurality of structures 71 are disposed in the region 61 and a plurality of structures 72 are disposed in the region 62 has been described. However, the plurality of structures 71 may not be disposed in the region 61. In this case, the region 61 guides the incident light to the PD 41 as it is. Such a region 61 may be filled with the material of the transparent layer 60. As described above with reference to FIG. 3 or the like, if the region 61 overlaps the PD 41 to be positioned inside the PD 41 in a plan view, light incident on the region 61 is guided to the PD 41, even if there is no light condensing function by the plurality of structures 71.

In the above embodiment, although SiN and $TiO_2$ are adopted as the materials of the structure 70, the material is not limited thereto. For example, for light having a wavelength of 380 nm to 1,000 nm (visible light to near-infrared light), SiN, SiC, $TiO_2$, GaN or the like may be used as the material of the structure 70. The material is suitable because it has a high refractive index and low absorption loss. When used for light having a wavelength of 800 to 1,000 nm (near infrared light), Si, SiC, SiN, $TiO_2$, GaAs, GaN and the like may be used as the material of the structure 70. The material is suitable because of its low loss. For light in the near-infrared region (communication wavelength of 1.3 µm, 1.55 µm, etc.) in the long wavelength band, InP or the like can be used as the material of the structure 70 in addition to the above-mentioned materials.

When the structure 70 is formed by pasting, coating, etc., polyimide such as fluorinated polyimide, benzocyclobutene (BCB), photocurable resin, UV epoxy resin, acrylic resin such as PMMA, polymer such as resist in general, etc. are mentioned as materials.

Although an example is shown in which $SiO_2$ and an air layer are assumed as the materials of the transparent layer 60 in the above embodiment, the present invention is not limited thereto. Any material having a refractive index lower than that of the material of the structure 70, including a general glass material, and having a low loss with respect to the wavelength of the incident light may be used. The transparent layer 60 may be a transparent layer having a laminated structure made of a plurality of materials. Further, since the transparent layer 60 may have for example, sufficiently low loss for the wavelength to reach the corresponding PD, it may be made of the same material as the color filter, and may be made of an organic material such as a resin. In this case, the transparent layer 60 is not only made of the same material as that of the color filter, but also may have a structure similar to that of the color filter, and may be designed to have an absorption feature corresponding to the wavelength of the light to be guided to each PD.

In the above embodiment, although the three primary colors R, G and B are taken as examples as the colors corresponding to the pixel 2, the pixel 2 may correspond to light having wavelengths other than the three primary colors (for example, infrared light or ultraviolet light).

In the above embodiment, an example of providing the optical phase delay amount distribution by changing the width W of the structure 70 has been described. However, the optical phase delay amount distribution may be provided by changing the refractive index of the structure 70 in addition to the width W or together with the width W. In this case, each of the structures 70 having different refractive indices may be made of a material having different refractive indices.

Although the present invention has been described on the basis of the specific embodiments, it is obvious that the present invention is not limited to the foregoing embodiments and can be changed in various ways within the scope of the invention.

The imaging element described above is specified, for example, as follows. As described with reference to FIGS. 1 to 3 and 21 to 26 and the like, the optical element 6 has a transparent layer 60 for covering the pixel 2 including the PD 41 and the PD 42, and a plurality of structures 70 disposed in the plane direction (XY plane direction) of the transparent layer 60 on the transparent layer 60 or inside the transparent layer 60. The transparent layer 60 includes a region 61 for guiding incident light to the PD 41, and a region 62 for guiding the incident light to the PD 42. The plurality of structures 70 are disposed in at least 62 of the region 61 and the region 62. The region 61 is smaller than the region 62.

According to the imaging element 12, the region 61 is smaller than the region 62. As a result, the light amount of the light guided to the PD 41 becomes smaller than the light amount of the light guided to the PD 42, and therefore, the PD 41 is less likely to saturate than PD42. For example, the dynamic range can be improved, by using the PD 41 as a low sensitivity photodiode, and using the PD 42 as a high sensitivity photodiode. Since the ratio of the amount of light guided to the whole PD to the incident light is very large (close to 100%), high light utilization efficiency can be realized. Therefore, both improvement in the dynamic range and improvement in the light utilization efficiency can be achieved.

As described with reference to FIGS. 5 to 11, and 18 to 20, the plurality of structures 70 are columnar structures having a refractive index higher than that of a portion between the plurality of structures 70, and at least some structures 70 of the plurality of structures 70 have widths W different from each other, in a plan view, and the plurality of structures may have the same height in a side view. At least some structures 70 of the plurality of structures 70 may have refractive indices different from each other. Each of the plurality of structures 70 may give an optical phase delay amount corresponding to the width W and the magnitude of the refractive index to the incident light. Each of the plurality of structures 70 may have a width W and a refractive index that provide an optical phase delay amount distribution for guiding light incident on the region 61 to the PD 41 and guiding light incident on the region 62 to the PD 42. The optical phase delay amount distribution may be an optical phase delay amount distribution for condensing light. For example, by disposing such a plurality of structures 70, the optical element 6 can be provided with a lens function, and the incident light can be guided, (for example, condensed) to the PD 41 and the PD 42. Further, the optical element 6 can be manufactured more easily than, for example, in a case in which a plurality of structures having different heights are provided.

As described with reference to FIG. 18 and FIG. 21, when the optical phase delay amount distribution in one of the regions 61A and 62A is not considered, the optical phase delay amount distribution in the other region may have symmetry. Since the optical phase delay amount distribution has symmetry, the possibility of obtaining a preferable lens pattern is increased. For example, the angle range of light incident on the right side (X-axis positive direction side) of the center of the lens, and the angle range of light incident on the left side (X-axis negative direction side) of the lens center are easily aligned.

As described with reference to FIG. 3 or the like, when viewed in plan view, PD41 and PD42 may have the same size. Thus, each PD can be disposed without a gap, for example, compared to a case of using PDs of different sizes, and light utilization efficiency can be enhanced.

As described with reference to FIG. 3 and the like, the region 61 may be located inside the region 62 in a plan view. For example, the small region 61 and the large region 62 can be disposed in this manner.

The imaging element 12 described with reference to FIG. 1 or the like is also an aspect of the present disclosure. That is, the imaging element 12 includes an optical element 6, and a plurality of pixels 2 each including a PD 41 and a PD 42. Thus, the imaging element 12 capable of achieving both improvement in dynamic range and improvement in light utilization efficiency can be obtained.

As described with reference to FIG. 2 or the like, the imaging element 12 may include a filter layer 5 provided between the pixel 2 and the optical element 6. Thus, for example, light of a color corresponding to the pixel 2 can be guided to the PD 41 and the PD 42.

The imaging apparatus 10 described with reference to FIG. 1 or the like is also an aspect of the present disclosure. That is, the imaging apparatus 10 includes an imaging element 12, and a signal processing control unit 13 for generating an image signal on the basis of an electric signal obtained from the imaging element 12. Thus, the imaging apparatus 10 capable of achieving both improvement in dynamic range and improvement in light utilization efficiency can be obtained.

The signal processing control unit 13 may perform an exposure control so that an exposure period of the PD 41 and an exposure period of the PD 42 are different from each other. For example, flicker can be suppressed, by making the exposure period of at least one of the PD 41 and the PD 42 longer than the blinking cycle of traffic lights, and the like. For example, by controlling exposure so that the exposure period of the PD 41 is longer than the exposure period of the PD 42, the exposure period of the PD 42 is suppressed to avoid saturation, and the occurrence of halation or the like can be suppressed.

REFERENCE SIGNS LIST

2 Pixel
3 Wire layer
4 PD layer
5 Filter layer
6 Optical element
10 Imaging apparatus
12 Imaging element
13 Signal processing control unit
41 PD
42 PD
60 Transparent layer
61 Region
62 Region
70 Structure
71 Structure
72 Structure

The invention claimed is:

1. An optical element comprising:
a transparent layer configured to cover a pixel including a first photoelectric conversion element and a second photoelectric conversion element; and
a plurality of structures disposed on the transparent layer or in the transparent layer in a plane direction of the transparent layer,
wherein the transparent layer includes
a first region configured to guide incident light to the first photoelectric conversion element, and
a second region configured to guide incident light to the second photoelectric conversion element,
the plurality of structures are disposed in at least the second region among the first region and the second region, and
the first region is smaller than the second region,
the first region is configured to overlap the first photoelectric conversion element and is located within a planar boundary of the first photoelectric conversion element in a plan view, and the first region is surrounded by the second region in the plan view.

2. The optical element according to claim 1, wherein
the plurality of structures are columnar structures having a refractive index higher than a refractive index of a portion between the plurality of structures,
in a plan view, at least some structures of the plurality of structures have widths different from each other, and
the plurality of structures have a same height when viewed in a side view.

3. The optical element according to claim 1, wherein
the plurality of structures are columnar structures having a refractive index higher than a refractive index of a portion between the plurality of structures,
at least some structures of the plurality of structures have different refractive indices from each other, and
the plurality of structures have a same height in a side view.

4. The optical element according to claim 1, wherein
each of the plurality of structures gives an optical phase delay amount corresponding to a size of a width of a structure in a plan view to incident light, and
each of the plurality of structures has a width which provides an optical phase delay amount distribution for guiding light incident on the first region to the first photoelectric conversion element and guiding light incident on the second region to the second photoelectric conversion element.

5. The optical element according to claim 1, wherein
each of the plurality of structures gives an optical phase delay amount corresponding to a magnitude of a refractive index of a structure to incident light, and
each of the plurality of structures has a refractive index which gives an optical phase delay amount distribution for guiding light incident on the first region to the first photoelectric conversion element and guiding light incident on the second region to the second photoelectric conversion element.

6. The optical element according to claim 4, wherein the optical phase delay amount distribution is an optical phase delay amount distribution for condensing light.

7. The optical element according to claim 4, wherein when the optical phase delay amount distribution in one region among the first region and the second region is not taken into consideration, the optical phase delay amount distribution in another region has symmetry.

8. The optical element according to claim 1, wherein the first photoelectric conversion element and the second photoelectric conversion element have a same size in a plan view.

9. The optical element according to claim 1, wherein the first region is located inside the second region in a plan view.

10. An imaging element comprising:
the optical element according to claim 1; and
a plurality of pixels each including the first photoelectric conversion element and the second photoelectric conversion element.

11. The imaging element according to claim 10, further including:
a filter layer provided between the pixel and the optical element.

12. An imaging apparatus comprising:
the imaging element according to claim 10; and
a signal processing control unit, including one or more processors, configured to generate an image signal based on an electric signal obtained from the imaging element.

13. The imaging apparatus according to claim 12, wherein the signal processing control unit is configured to perform an exposure control so that an exposure period of the first photoelectric conversion element and an exposure period of the second photoelectric conversion element are different from each other.

14. An optical element comprising:

a transparent layer for covering a pixel including a first photoelectric conversion element and a second photoelectric conversion element; and a plurality of recesses disposed in a plane direction of the transparent layer on the transparent layer, wherein the transparent layer includes a first region configured to guide incident light to the first photoelectric conversion element, and a second region configured to guide incident light to the second photoelectric conversion element, the plurality of recesses are disposed in at least the second region among the first region and the second region, and the first region is smaller than the second region, the first region is configured to overlap the first photoelectric conversion element and is located within a planar boundary of the first photoelectric conversion element in a plan view, and the first region is surrounded by the second region in the plan view.

15. The optical element according to claim 14, wherein with a fluid having a refractive index higher than that of a material constituting the plurality of recesses, voids of the plurality of recesses are filled.

16. The optical element according to claim 14, wherein a material constituting the plurality of recesses is a meta-material with a refractive index lower than 1.

* * * * *